(12) United States Patent
Chen et al.

(10) Patent No.: US 7,538,351 B2
(45) Date of Patent: May 26, 2009

(54) METHOD FOR FORMING AN SOI STRUCTURE WITH IMPROVED CARRIER MOBILITY AND ESD PROTECTION

(75) Inventors: Hung-Wei Chen, Hsin-Chu (TW); Hsun-Chih Tsao, Hsin-Chu (TW); Kuang-Hsin Chen, Hsin-Chu (TW); Di-Hong Lee, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 177 days.

(21) Appl. No.: 11/089,405

(22) Filed: Mar. 23, 2005

(65) Prior Publication Data

US 2006/0214226 A1 Sep. 28, 2006

(51) Int. Cl.
*H01L 29/10* (2006.01)
(52) U.S. Cl. .................. 257/67; 257/E27.062; 438/152
(58) Field of Classification Search .................. 438/279, 438/198, 199, 221, 275, 296, 429, 430; 257/192, 257/67, 74, 627, 628
See application file for complete search history.

(56) References Cited

U.S. PATENT DOCUMENTS

| | | | | |
|---|---|---|---|---|
| 4,933,298 | A * | 6/1990 | Hasegawa | 438/150 |
| 5,155,571 | A * | 10/1992 | Wang et al. | 257/19 |
| 5,708,288 | A * | 1/1998 | Quigley et al. | 257/355 |
| 6,586,306 | B2 * | 7/2003 | Lee et al. | 438/305 |
| 2005/0093104 | A1 * | 5/2005 | Ieong et al. | 257/627 |
| 2006/0157687 | A1 * | 7/2006 | Doyle et al. | 257/19 |

FOREIGN PATENT DOCUMENTS

| | | |
|---|---|---|
| TW | 591798 | 6/2004 |
| TW | 530385 | 4/2008 |

OTHER PUBLICATIONS

Mobility-Enhancement Technologies, Circuits and Devices Magazine Liu et al., IEEE, vol. 21, Issue 3, p. 21-36, May-Jun. 2005.

* cited by examiner

*Primary Examiner*—W. David Coleman
*Assistant Examiner*—Sonya D McCall-Shepard
(74) *Attorney, Agent, or Firm*—Thomas, Kayden, Horstemeyer & Risley

(57) ABSTRACT

A semiconductor device and method for forming the same including improved electrostatic discharge protection for advanced semiconductor devices, the semiconductor device including providing semiconductor substrate having a preselected surface orientation and crystal direction; an insulator layer overlying the semiconductor substrate; a first semiconductor active region overlying the insulator layer having a first surface orientation selected from the group consisting of <100> and <110>; a second semiconductor active region extending through a thickness portion of the insulator layer having a second surface orientation selected from the group consisting of <110> and <100> different from the first surface orientation; wherein MOS devices including a first MOS device of a first conduction type is disposed on the first semiconductor active region and a second MOS device of a second conduction type is disposed on the second semiconductor active region.

28 Claims, 4 Drawing Sheets

METHOD FOR FORMING AN SOI STRUCTURE WITH IMPROVED CARRIER MOBILITY AND ESD PROTECTION

FIELD OF THE INVENTION

This invention generally relates to microelectronic integrated circuit (IC) semiconductor device fabrication and more particularly to a method for forming silicon-on-insulator (SOI) structures having improved majority carrier mobility and improved electrostatic discharge (ESD) protection.

BACKGROUND OF THE INVENTION

With increasing demands for advanced device structures, the use of dopants to control the conducting channel in traditional CMOS devices is reaching its limits. As CMOS devices are scaled to the nanometer regime, SOI structures including fully depleted (FD) and partially depleted (PD) structures have provided an evolutionary pathway for MOSFETS operating at low power. CMOS designs below about 0.1 microns are plagued by shortcomings such as short channel effects (SCE) and gate oxide tunneling. In addition, severe restraints are placed on the uniformity of the active silicon channel region which is correspondingly reduced in dimension. One approach to overcome such shortcomings is to change the device structure such that the gate length may be scaled down while using thicker gate oxides and increased active silicon channel dimensions.

For example FET designs have included forming non-planar active silicon regions by forming double gated fin-like silicon channel structures also referred to as finFETs and triple gated structures referred to a tri-gate FETs.

While these structures have been shown to have acceptable short channel behavior and may be formed with conventional gate oxide thicknesses to overcome gate oxide tunneling, majority carrier mobility, is frequently compromised by prior art SOI formation processes.

Another shortcoming of prior art SOI fabrication processes and devices is that the potential for damage from ESD events is increased due to the relatively thin silicon regions formed over the buried oxide layer. For example Input/output (I/O) areas are typically electrically connected to the upper silicon channel layer, which in SOI devices is not sufficiently thick to adequately dissipate excess heat generated by ESD events thereby potentially causing catastrophic failure of the device.

There is therefore a need in the microelectronic integrated circuit (IC) processing art to develop a method for forming active silicon channel regions including non-planar structures such as those included in finFETs and tri-gate FETs to improve charge carrier mobility as well as improving ESD protection for SOI circuits.

It is therefore an object of the invention to provide a method for forming active silicon channel regions including non-planar structures such as those included in finFETs and tri-gate FETs to improve charge carrier mobility as well as improving ESD protection for SOI circuits, while overcoming other shortcomings and deficiencies of the prior art.

SUMMARY OF THE INVENTION

To achieve the foregoing and other objects, and in accordance with the purposes of the present invention, as embodied and broadly described herein, the present invention provides a semiconductor device with improved charge carrier mobility and ESD protection and method for forming the same.

In a first embodiment, the semiconductor device includes providing semiconductor substrate having a pre-selected surface orientation and crystal direction; an insulator layer overlying the semiconductor substrate; a first semiconductor active region overlying the insulator layer having a first surface orientation selected from the group consisting of <100> and <110>; a second semiconductor active region extending through a thickness portion of the insulator layer having a second surface orientation selected from the group consisting of <110> and <100> different from the first surface orientation; wherein MOS devices including a first MOS device of a first conduction type is disposed on the first semiconductor active region and a second MOS device of a second conduction type is disposed on the second semiconductor active region.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

Although the method of forming SOI structures of the present invention is particularly advantageous in the formation of advanced non-planar FET devices such as finFETs and tri-gate FETs it will be appreciated that the inventive concept may be applied to the formation of conventional planar CMOD devices as well as a combination of planar and non-planar CMOS devices. The invention is particularly advantageous in forming input/output CMOS channel regions, forming a portion of an ESD protection circuit where the I/O CMOS channel region is advantageously formed with a pre-selected crystal orientation and channel direction to either contact the bulk silicon substrate or form a thicker (deeper) epitaxial silicon channel region for improved charge carrier mobility and improved heat dissipation to improve ESD protection circuits.

Figure 1A:
FIGS. 1A-1F are cross sectional side views of an exemplary SOI device at stages in manufacture according to an embodiment of the present invention.

For example referring to FIG. 1A is shown a cross sectional view of an exemplary portion of an SOI structure at a stage in manufacture. Shown is a silicon substrate 12 provided with a selected surface crystal orientation relative to direction Z and bulk channel (crystal) direction relative to e.g., direction X.

For example it has been found that charge carrier mobility is optimized for N-type conductivity (electron majority charge carriers), e.g., NMOS devices, where the silicon substrate orientation, and thus a subsequently formed overlying silicon active region (e.g., channel region) includes a (100) surface orientation with one of a <110> and <100> channel (crystal) direction as further explained below. Advantageously, it has additionally been found that that charge carrier mobility is significantly improved for P-type conductivity (hole majority charge carriers), e.g., PMOS devices, where the silicon substrate orientation, and thus a subsequently grown overlying active silicon region (channel region) as further explained below, includes a (100) surface orientation with a <110> crystal (channel) direction. Alternatively, to maximize both N carrier mobility and P carrier mobility in a respective NMOS channel region and PMOS channel region a silicon substrate orientation with a (110) surface orientation with a <110> crystal direction may be provided followed by forming an epitaxial silicon NMOS channel region having a <100> crystal direction substantially parallel to the substrate <110> crystal direction, while forming a PMOS channel region having either SiGe or epitaxial silicon with a (110) surface orientation with a <110> crystal direction.

Figure 1B:
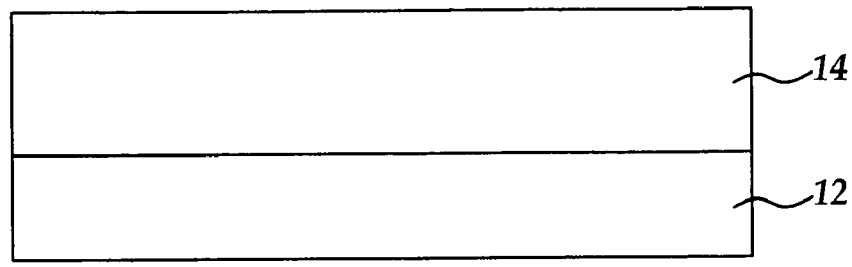

Referring to FIG. 1B, following selection of an appropriate silicon substrate orientation for forming NMOS or PMOS FET devices with preferred channel (crystal) directions and surface orientations, a first layer 14 of epitaxial silicon (epi layer) is grown by conventional methods to have substantially the same surface orientation and crystal direction as the substrate. It will be appreciated that the thickness of the epi layer 14 may vary depending on the subsequent buried oxide layer formation process and the FET device to formed, but may typically range from about 150 Angstroms to about 7000 Angstroms. For the formation of PMOS devices, the epitaxial silicon layer 14 may include germanium to form a SiGe alloy by processes known in the art.

Figure 1C:
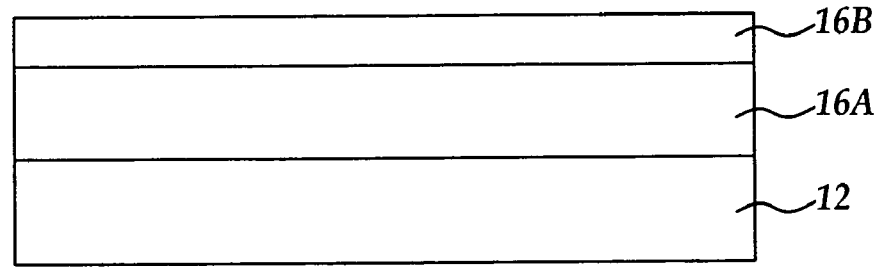

Referring to FIG. 1C, a first buried oxide layer (region) 16A, is formed by conventional methods, for example including a high energy (e.g., 200-1000 keV) implant of oxygen ions into the epitaxial silicon layer 14 followed by a high temperature anneal at about 1200° C. to about 1350° C. It will be appreciated that conventional methods including high dose and low dose SIMOX as well as ITOX processes may be used to form the buried oxide (silicon oxide) region 14B. For example, the buried oxide (BOX) region 16A is produced having a thickness of between about 100 Angstroms and about 5000 Angstroms, preferably with a lowermost portion contacting the silicon substrate 12. The remaining portion 16B of epitaxial silicon layer portion 14 overlying the buried oxide region 16A preferably has a thickness of from about 50 Angstroms to about 2000 Angstroms. It will be appreciated that the desired thickness of the epi silicon layer 14, the BOX region 16A and the remaining uppermost epi silicon layer portion 16B may vary depending on the desired feature size, design constraints, and device application.

Figure 1D:
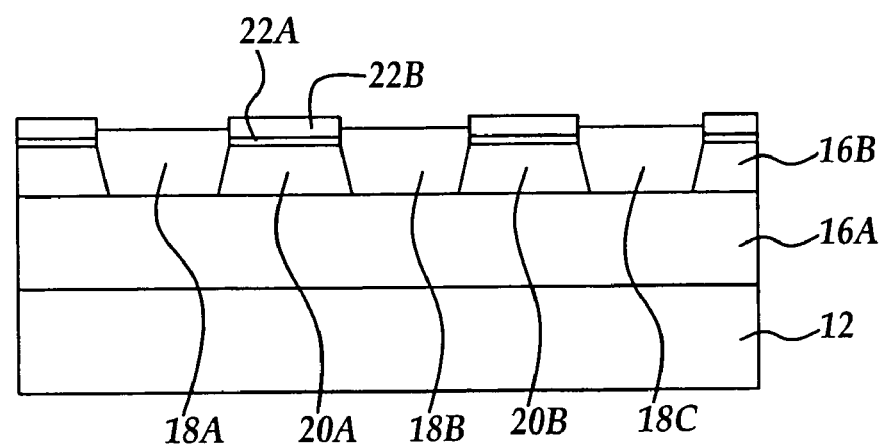

Referring to FIG. 1D, shallow trench isolation (STI) regions, e.g., 18A, 18B, 18C are formed according to conventional processes including leaving surrounding active device pedestals e.g., 20A and 20B. For example a pad oxide layer 22A is formed by conventional dry or wet thermal oxidation methods, followed by formation of an overlying nitride layer 22B, e.g., LPCVD silicon nitride. It will be appreciated that other methods of electrical isolation such as LOCOS or MESA isolation may be used. A nitride etching mask is then formed in nitride layer 22B followed by conventional etching processes to form STI trenches. Oxide or nitride liners may then optionally be formed (not shown) in the STI trenches prior to backfilling with CVD or HDP-CVD silicon oxide (STI oxide) and a CMP planarization process to remove excess STI oxide above the nitride layer 22 to form STI regions, e.g., 18A, 18B, 18C.

Figure 1E:
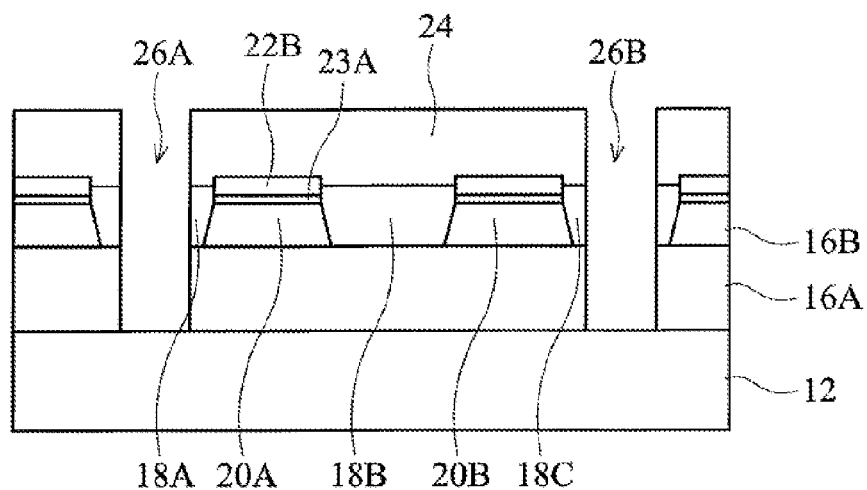

Referring to FIG. 1E, a conventional lithographic process, including photon, x-ray or electron energy illumination sources, is then undertaken including depositing and patterning resist layer 24 over the process surface to form an etching mask exposing a portion of selected STI regions e.g., 18A, and 18C. A conventional dry etching process, for example a reactive ion etch (RIE) process, is then carried out to etch through a thickness of the STI oxide regions and the buried oxide (BOX) region 16A to expose the underlying silicon substrate 12 and form etched openings 26A and 26B. Preferably the etched openings are surrounded by a remaining portion of the STI oxide regions e.g., 18A and 18C.

Figure 1F:
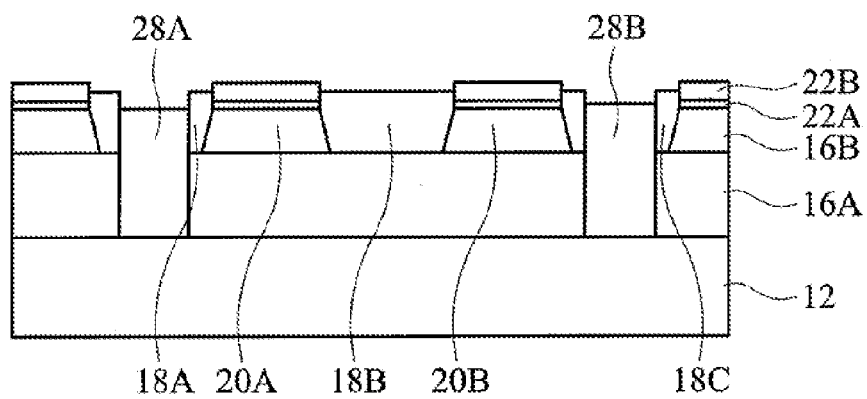

Referring to FIG. 1F according to an aspect of the present invention, following removal of resist layer 24, and cleaning of the exposed silicon substrate portions at the bottom of etched openings e.g., 26A and 26B in FIG. 1E, a second epitaxial silicon layer (active silicon region) is grown with preferred surface orientation and crystal direction as previously outlined, depending on whether an NMOS or PMOS device will be subsequently formed, to at least partially fill the openings 26A and 26B to form first and second channel regions (active regions) e.g., 28A and 28B. It will additionally be appreciated that SiGe may be deposited by conventional methods to at least partially file a PMOS active channel regions e.g., 28A and/or 28B. Preferably the active channel regions are filled with preferred material e.g., either Si or SiGe to substantially filling the openings, preferably to about the same level as the upper level of the first epitaxial layer portion 16B. Preferably, the first and second active channel regions e.g., 28A and 28B have a thickness in the range of about 50 Angstroms to about 2000 Angstroms.

Figure 2A:
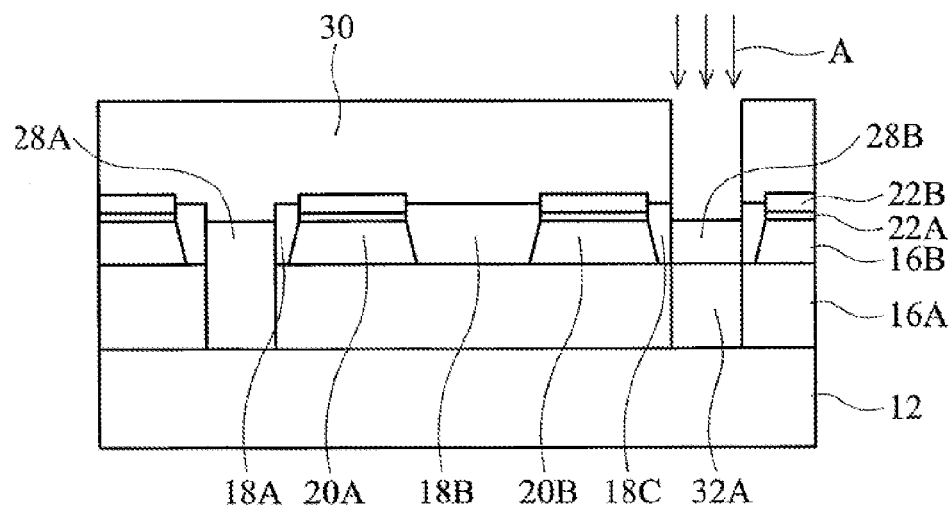
FIGS. 2A-2E are cross sectional side views of an exemplary SOI device at stages in manufacture according to different embodiments of the present invention.

Referring to FIG. 2A, in one embodiment, a resist layer 30 is deposited and patterned to expose a first portion of second active channel region, e.g., 28B, for an oxygen ion implant process to form a second buried layer while leaving a portion of first active channel region, e.g., 28A covered by the resist layer 30. For example, the first channel regions, e.g., 28A will subsequently be preferably used for formation of overlying first active MOSFET (FET) devices, preferably a PMOS device serving as input/output portions of an ESD protection circuit in electrical contact with the underlying silicon substrate 12, while the second active region e.g., 28B may be used to form overlying second active NMOS or PMOS MOSFET devices as a portion of core circuitry.

Still referring to FIG. 2A, a conventional oxygen ion implantation process e.g., directional arrows A is carried out followed by an annealing process to form a second BOX layer portion e.g., 32A in a portion of second channel region e.g., 28B to a predetermined thickness. In one embodiment as shown in FIG. 2A the second BOX layer 32A is formed to about the same thickness and depth as the originally formed (first) BOX layer 16A. For example the first and second buried oxide layers have a thickness ranging from about 100 Angstroms to about 5000 Angstroms.

For example, planar and/or non-planar NMOS or PMOS FET devices may be formed over the channel regions 28A and 28B depending on subsequent processes.

Figure 2B:
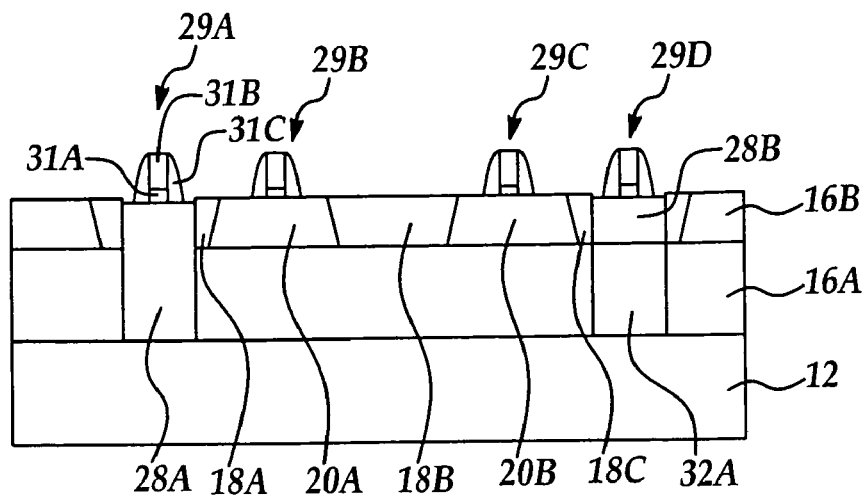

For example, in the embodiment shown in FIG. 2B, conventional planar (CMOS) MOSFET devices e.g., 29A, 29B, 29C, and 29D are shown formed over respective channel regions including first channel region e.g., 28A which will preferably be used as an I/O portion of an ESD circuit in electrical contact with the silicon substrate 12. For example, the overlying nitride layer 22A and pad oxide layer 22B are removed over portions of the process surface by conventional wet etching processes, for example using e.g., hot $H_3PO_4$ and HF, leaving STI oxide isolation regions adjacent the channel regions e.g., 28A and 28B. Conventional processes are then undertaken to form a planar FET. For example, a gate dielectric 31A (e.g., $SiO_2$, oxynitride, oxide/nitride, high permittivity (high-K) dielectric, or combinations thereof is grown or deposited followed by forming the gate electrode 31B (e.g., polysilicon, fully-silicided poly, or metal) and sidewall spacers e.g., 31C including adjacent source/drain contact regions (not shown).

The gate dielectric e.g., 31A may be formed by any process known in the art, e.g., thermal oxidation, nitridation, sputter deposition, or chemical vapor deposition. The physical thickness of the gate dielectric is preferably in the range of 5 to 100 Angstroms. When using a high permittivity (high-K) dielectric, preferably the dielectric constant is greater than about 8. The high-K dielectric is preferably selected from a group comprising aluminum oxide ($Al_2O_3$), hafnium oxide ($HfO_2$), hafnium oxynitride (HfON), hafnium silicate ($HfSiO_4$), zirconium oxide ($ZrO_2$), zirconium oxynitride (ZrON), zirconium silicate ($ZrSiO_2$), yttrium oxide ($Y_2O_3$), lanthanum oxide ($La_2O_3$), cerium oxide ($CeO_2$), titanium oxide ($TiO_2$), tantalum oxide ($Ta_2O_5$), or combinations thereof. The silicon oxide equivalent oxide thickness (EOT) of the gate dielectric is preferably larger than about 5 Angstroms, more preferably larger than about 20 Angstroms, and even more preferably larger than about 40 Angstroms.

The gate electrode 31B may be formed of conventional polysilicon, polysilicon-germanium, metals, metal silicides, metal nitrides, or conductive metal oxides. In a preferred embodiment, the gate electrode is formed of polysilicon. Metals such as molybdenum, tungsten, titanium, tantalum, platinum, and hafnium may be used in an upper portion of the gate electrode 31B. Metal nitrides may include, but are not limited to, molybdenum nitride, tungsten nitride, titanium nitride, and tantalum nitride. Conductive metal oxides may include, but are not limited to, ruthenium oxide and indium tin oxide.

The gate electrode material may be deposited by conventional techniques such as CVD methods. The gate electrode material may also be formed by the deposition of silicon and metal, followed by an annealing process to form a metal silicide gate electrode material. A patterned gate mask is then formed on the gate electrode material using deposition and photolithographic techniques. The gate mask may employ commonly used masking materials such as, but not limited to, silicon oxide silicon oxynitride, and silicon nitride. The gate electrode is then etched using a plasma etch process to form the gate electrode. A conventional source/drain extension ion implant process may then be carried out followed by offset spacer formation processes known in the art. For example, multi-layered dielectric spacers including silicon oxide and silicon nitride may be formed, followed by a second ion implant process at higher energies and dopant ion flux to form source/drain regions.

The electrical resistance of the source/drain regions may be reduced by the formation of self-aligned silicided (salicides), for example $CoSi_2$ and $TiSi_2$ by first depositing Co or Ti over the source/drain regions followed by an annealing process to form the low electrical resistance phase of the silicide.

Still referring to FIG. 2B, following formation of the CMOS structures (e.g., planar MOSFET), e.g., NMOS and PMOS structures e.g., 29A, 29B, 29C, and 29D, a stressed dielectric layer e.g., 36A is preferably deposited over the CMOS structures, optionally followed by deposition of an overlying passivation layer 36B. The stressed dielectric layer 36A is preferably formed of silicon nitride and/or silicon oxynitride deposited by CVD process such as LPCVD, atomic layer CVD, or plasma enhanced CVD and optionally includes an overlying CVD silicon oxide passivation layer 36B. The stressed dielectric layer is preferably deposited in at least in compressive stress over the PMOS structures and preferably including deposition in tensile stress over the NMOS structures each stress type having a stress level up to about 2 GPa, for example from about 200 MPa to about 2 GPa. The formation of the appropriate stress type and level over the NMOS and PMOS devices acts to improve charge carrier mobility and improve device performance including drive current ($I_D$). Preferably the stressed dielectric layer is formed to exert primarily a strain in a source to drain direction, e.g., parallel to the gate dielectric 31A, e.g., corresponding to an active channel crystal direction.

For example, it has been found that by forming a channel region e.g., 28A in electrical contact with the silicon substrate 12 according to preferred embodiments, which forms a subsequent electrical discharge pathway (I/O) for a conventional ESD protection circuit, that ESD protection is significantly enhanced by providing a larger thermal mass to act as a heat sink thereby more efficiently dissipating heat during ESD events and avoiding catastrophic failure.

Figure 2C:
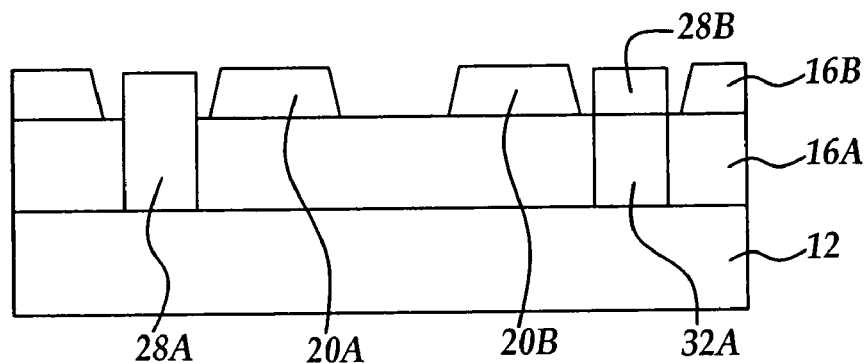

Referring to FIG. 2C, in another embodiment, a non-planar FET device is preferably formed over the channel region, e.g., 28A and 28B, the first channel region 28A preferably forming an I/O portion of an ESD circuit. In this embodiment, following forming the second BOX region, e.g., 32A in second channel region 2B, shown in FIG. 2A, the resist implant mask e.g., 30 is removed, followed by a conventional wet etching processes to first remove the nitride mask 22B and underlying STI oxide portions e.g., 18, for example an $H_3PO_4$ etch followed by an HF etch. A vertically protruding portion of the first and second channel regions 28A and 28B is left protruding above the process surface, for example, preferably having faceted or rounded corners which may be used to form a non-planar NMOS or PMOS device, for example a FinFET or triple gate FET.

Figure 2D:
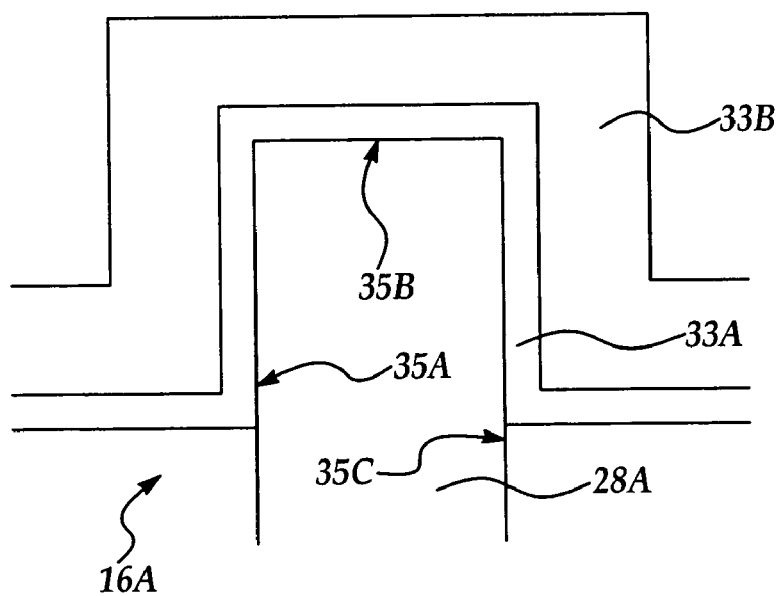

For example, referring to FIG. 2D is shown an expanded portion of an exemplary non-planar device, also referred to as a vertical channel device, e.g., a FinFET or tri-gate FET device in cross section where similarly numbered structures refer to structures shown in previous Figures. The non-planar device is preferably formed over protruding channel regions channel regions e.g., 28A by conventional processes including forming a gate dielectric 33A layer using preferred materials as previously outlined for the planar device followed by forming the gate electrode 33B layer to form a multiple gate regions e.g., 35A, 35B, and 35C. The same preferred materials and processes previously outlined above with respect to forming the planar MOSFET (NMOS or PMOS) device e.g., gate dielectric 31A and gate electrode 31B are preferably used for forming the gate dielectric 33A and the gate electrode 33B. In addition, the same preferred materials and processes are used for forming S/D and SDE regions, and salicide regions. In addition the formation of an overlying stressed dielectric layer and optionally formed passivation layer as previously outline e.g., 36A and 36B are preferably deposited over the gate electrode e.g., 33B as previously shown to form a strain in the channel region having a source to drain direction to improve charge mobility.

Figure 2E:
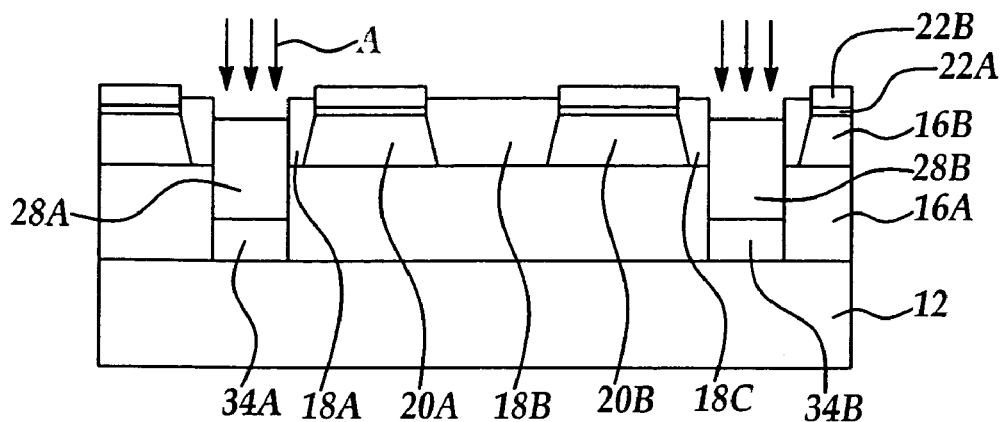

Referring to FIG. 2E, is shown another embodiment for forming the second buried oxide (BOX) layer, preferred for use with PMOS devices. Shown in FIG. 2E, the second BOX layer portions e.g., 34A and 34BB are formed by an oxygen ion implant process e.g., e.g., directional arrows A, in both first and second channel regions e.g., 28A and 28B at a thickness less than the original BOX region 16A, consequently forming first and second channel regions 28A and 28B have a greater depth than the original upper silicon epitaxial layer 16B. In this embodiment, no resist mask need be formed as the STI oxide portions and overlying nitride mask act as an implant mask. For example, this configuration is preferred for PMOS devices since for NMOS devices formed in this configuration, threshold Voltage ($V_t$) shift is compromised due to electrical charge accumulation, also referred to as the floating body effect, caused by impact ionization of electron majority charge carriers.

For example, as is known in the art of ion implantation, the oxygen implant profile and depth and second BOX region thickness e.g., 34A, 34B can be controlled by dosage and implant energy, as well as annealing profiles and ambient annealing conditions. For example, the second BOX layer regions 34A and 34B are preferably formed with a lowermost portion adjacent the silicon substrate 12 and with a thickness of from about 1 to about 4 of the originally first BOX region e.g., 16A to form deeper channel regions e.g., 28A, 28B, compared to channel depths formed in the first formed epi layer e.g., 16B. Preferably the first and second buried oxide layers are formed having a thickness of about 100 Angstroms to about 5000 Angstroms.

Planar and/or non-planar FET devices are then formed over the channel regions e.g., 28A and 28B as previously described according to FIGS. 2B and 2D, including using a channel region for forming an input/output portion (electrical discharge pathway) of an ESD protection circuit, such circuits known in the art.

The numerous advantages of the various embodiments of the invention include improved majority charge carrier mobility by selecting a silicon substrate surface orientation and crystal direction and surface orientation and crystal direction for subsequently formed channel regions to optimize charge carrier mobility. Additional advantages include forming a channel region, preferably a PMOS or NMOS channel region that provides improved ESD protection by either forming electrical contact with the silicon substrate or by providing an increased depth of floating channel regions, preferably PMOS channel regions, according to a BOX layer formation process to increase a thermal mass for heat dissipation in ESD and improve ESD circuit response according to improved charge carrier mobility. Yet additional advantages include the ability to form either planar or advanced non-planar multi-gate devices, such as a fin FET or triple-poly gate device. As ESD events become more important at decreased device sizes including non-planar device geometries, in part due to the increasing thinness of the upper epitaxial layer, such advanced SOI devices are made more reliable and efficient, including improved ESD protection with increased charge mobility.

Figure 3:
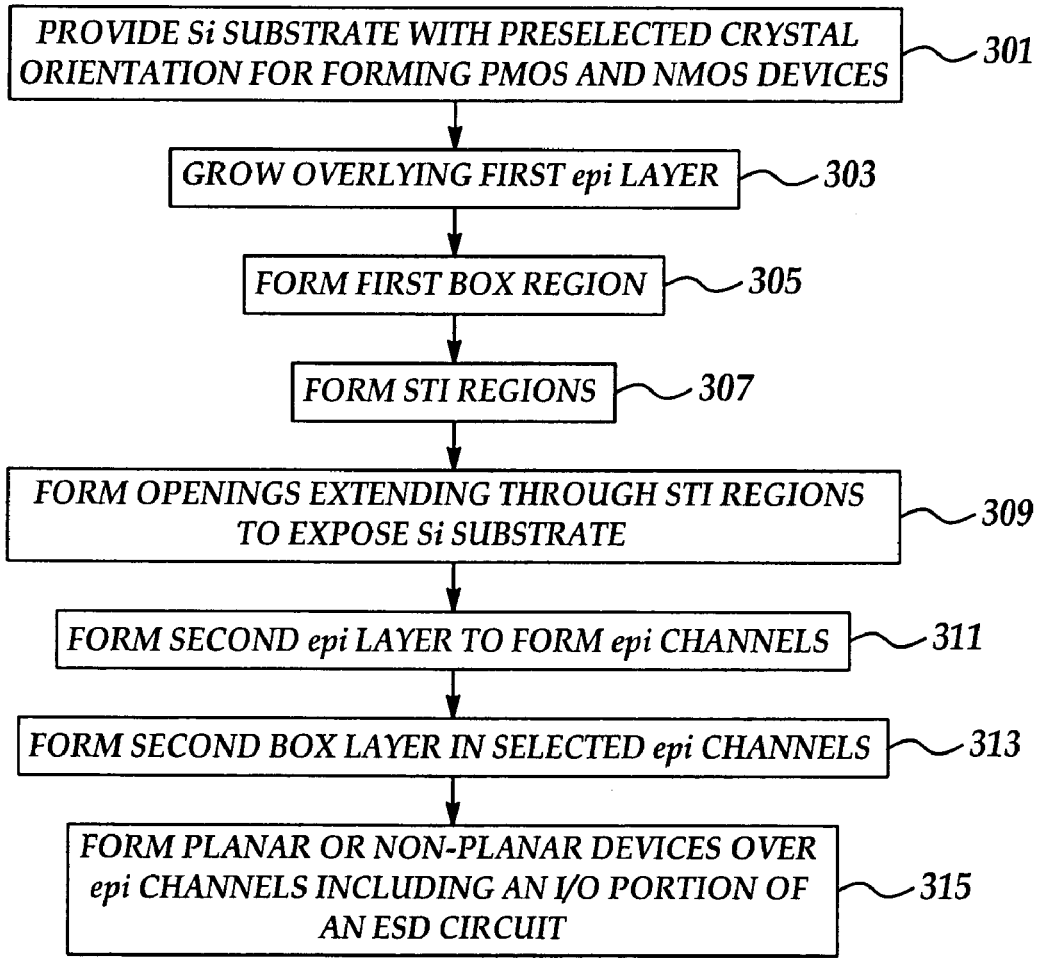
FIG. 3 is a process flow diagram including several embodiments of the present invention.

Referring to FIG. 3 is shown a process flow diagram including several embodiments of the present invention. In process 301 a silicon substrate is provided having a pre-selected process surface crystal orientation and bulk channel direction to optimize a charge carrier mobility. In process 303, a first epitaxial layer is grown over the silicon substrate. In process 305, a first BOX region is formed in the first epitaxial layer. In process 307, STI regions are formed. In process 309, etched openings are formed through the STI regions to expose the silicon substrate. In process 311, a second epitaxial layer is formed in the etched openings to about the same level as the first epitaxial silicon layer to form a plurality of epi channel regions. In process 313, a second BOX region is formed in selected portions including all of the epi channel regions to form the same or an increased epi channel depth (thickness)including contacting (no second BOX region) the silicon substrate. In process 315, planar or non-planar FET devices are formed over the selected channel regions including FET devices forming an input/output (I/O) portion of an ESD circuit.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A semiconductor device comprising:
   a semiconductor substrate comprising a pre-selected surface orientation and crystal direction;
   a first insulator layer overlying the semiconductor substrate;
   a first semiconductor active region, overlying the first insulator layer, having a first surface orientation selected from the group consisting of (100) and (110);
   a trench isolation structure overlying the first insulator layer and neighboring the first semiconductor active region;
   an opening disposed in the trench isolation structure and the first insulator layer and extending through the trench isolation structure and the first insulator layer;
   a second insulator layer disposed in the opening only and overlying the semiconductor substrate;
   a second semiconductor active region, disposed in the opening only and not extending out of the opening, having a second surface orientation selected from the group consisting of (110) and (100) different from the first surface orientation, and overlying the second insulator layer; and
   wherein MOS devices comprising a first MOS device disposed on the first semiconductor active region and a second MOS device disposed on the second semiconductor active region.

2. The semiconductor device of claim 1, wherein the first and second semiconductor active regions comprise respective strained channel regions.

3. The semiconductor device of claim 2, wherein the strained channel regions comprises a strain primarily in a source to drain direction.

4. The semiconductor device of claim 1, wherein the second semiconductor active region comprises a portion of an electrostatic discharge circuit in electrical communication with the semiconductor substrate.

5. The semiconductor device of claim 4, wherein the second semiconductor active region further comprise an I/O.

6. The semiconductor device of claim 5, wherein a gate dielectric layer of I/O is thicker than a gate dielectric layer of the first MOS device.

7. The semiconductor device of claim 1, further comprising at least one stressed dielectric layer disposed over at least one of the first and second MOS devices to form a respective strained channel region.

8. The semiconductor device of claim 1, wherein the MOS devices comprise multiple gate structures.

9. The semiconductor device of claim 1, wherein the multiple gate structures are selected from the group consisting of a FinFET gate structure and a triple gate structure.

10. The semiconductor device of claim 1, wherein the first and second MOS devices are electrically isolated by the trench isolation structure.

11. A method of forming a semiconductor device comprising:
   providing a semiconductor substrate comprising a pre-selected surface orientation and crystal direction;
   forming a first insulator layer overlying the semiconductor substrate;
   forming a first semiconductor active region, overlying the first insulator layer, having a first surface orientation selected from the group consisting of (100) and (110);

forming a trench isolation structure overlying the first insulator layer and neighboring the first semiconductor active region;

forming an opening disposed in the trench isolation structure and the insulator layer and extending through the trench isolation structure and the first insulator layer;

forming a second semiconductor active region, disposed in the opening only and not extending out of the opening, having a second surface orientation selected from the group consisting of (110) and (100) different from the first surface orientation;

implanting oxygen ions into the second semiconductor active region, forming a second insulator layer between the semiconductor substrate and the remaining second semiconductor active region; and, forming a first MOS device of a first conduction type on the first semiconductor active region and a second MOS device of a second conduction type on the second semiconductor active region.

12. The method of claim 11, wherein the first and second semiconductor active regions comprise respective strained channel regions.

13. The method of claim 12, wherein the strained channel regions comprises a strain primarily in a source to drain direction.

14. The method of claim 11, wherein the second semiconductor active region is formed in electrical communication with the semiconductor substrate for receiving a portion of an electrostatic discharge signal.

15. The method of claim 11, wherein the semiconductor substrate and the first and second semiconductor active regions comprise silicon.

16. The method of claim 11, wherein the first semiconductor active region has a surface orientation of (100) and the second semiconductor active region has a surface orientation of (110).

17. The method of claim 11, wherein the first semiconductor active region has a surface orientation of (110) and the second semiconductor active region has a surface orientation of (100).

18. The method of claim 11, wherein a NMOS device is formed on the first semiconductor active region and a PMOS device is formed on the second semiconductor active region.

19. The method of claim 11, wherein a PMOS device is formed on the first semiconductor active region and a NMOS device is formed on the second semiconductor active region.

20. The method of claim 11, further comprising forming at least one stressed dielectric layer over at least one of the first and second MOS devices to form a respective strained channel region.

21. The method of claim 11, wherein the MOS devices comprise multiple gate structures.

22. The method of claim 21, wherein the multiple gate structures are selected from the group consisting of a FinFET gate structure and a triple gate structure.

23. The method of claim 11, wherein the first and second semiconductor active regions are formed with one of a faceted or rounded corner.

24. The method of claim 11, wherein the first and second MOS devices are electrically isolated by-the trench isolation structure.

25. The method of claim 11, wherein the first and second semiconductor active regions are separated by the first insulator layer.

26. The method of claim 25, wherein the first insulator layer comprises a buried oxide layer.

27. The semiconductor device of claim 1, wherein the second insulator layer is with a thickness between one fourth to three fourth of that of the first insulator layer.

28. The method of claim 11, wherein the second insulator layer is with a thickness between one fourth to three fourth of that of the first insulator layer.

* * * * *